(12) United States Patent
Dearborn et al.

(10) Patent No.: US 7,576,979 B1
(45) Date of Patent: Aug. 18, 2009

(54) MODULAR SERVER HANDLE

(75) Inventors: Timothy C. Dearborn, Lakeway, TX (US); George Hoh, Round Rock, TX (US); Brandon Joel Brocklesby, Pflugerville, TX (US); Scott Lauffer, Austin, TX (US); Richard Crisp, Austin, TX (US); Paul Kramer, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 12/117,971

(22) Filed: May 9, 2008

(51) Int. Cl.
*G06F 1/16* (2006.01)

(52) U.S. Cl. .................. 361/679.38; 606/167; 600/219; 399/262

(58) Field of Classification Search .................. 81/491; 399/262; 606/167, 120; 600/222, 219; 7/128; 144/130; 361/679.32–679.41, 679.17, 679.3
See application file for complete search history.

(56) References Cited

U.S. PATENT DOCUMENTS

| | | | |
|---|---|---|---|
| 6,661,671 B1 * | 12/2003 | Franke et al. | 361/752 |
| 6,762,934 B2 | 7/2004 | Kitchen et al. | |
| 7,125,272 B1 * | 10/2006 | Liang | 439/160 |
| 2007/0042647 A1 * | 2/2007 | Chuang | 439/620.29 |

* cited by examiner

*Primary Examiner*—Hung V Duong
(74) *Attorney, Agent, or Firm*—Hamilton & Terrile, LLP; Stephen A. Terrile

(57) ABSTRACT

An improved modular server handle mechanism. The handle mechanism provides a translating handle mechanism that does not visibly function like a cam lever, and provides a carry handle solution when transporting the blade. In operation, to remove a blade server, a user pushes a button that releases the handle from a locked position. The handle is then pulled, and the cam levers undock the blade module from the chassis. When the cam motion is complete, the handle "locks out" in an open position to provide a carry handle.

14 Claims, 9 Drawing Sheets

MODULAR SERVER HANDLE

BACKGROUND OF THE INVENTION

1. Field of the Invention

The present invention relates to information handling systems and more particularly to a modular handle for use with server type information handling systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The amount of data information handling systems manage continues to grow, driving the need for scalable systems that not only sustain information integrity and availability, but also make efficient use of computing resources. A popular approach to addressing this need is the use of blade servers, which generally comprise a number of individual computer blades housed within a chassis that provides a common power supply, cooling, and management resources. Each computer blade typically includes one or more processors, computer memory, network connections, and computer storage. An advantage to this approach is that users, applications, and/or processes can be assigned to specific computer blades and/or spread across available resources. As additional processing power or capacity is needed, additional computer blades are added to the blade server.

Servicing and replacing a blade server can require a multi-stepped approach to removing and replacing the unit. In addition to removal and replacement, providing a convenient means for carrying the blade module is also an issue.

It is known to use cam lever arms to provide insertion and removal mechanisms for blade modules. One issue relating to cam lever arms is that the cam levers must be actuated before the blade module can be removed. Additionally, when transporting the blade modules there is no physical carry handle and many finger trap opportunities.

Accordingly, it would be desirable to provide a mechanism for facilitating removal and replacement of blade modules while also facilitating carrying the blade module.

SUMMARY OF THE INVENTION

In accordance with the present invention, an improved modular server handle is set forth. The present invention provides a translating handle mechanism that does not visibly function like a cam lever, and provides a carry handle solution when transporting the blade. In operation, to remove a blade server, a user pushes a button that releases the handle from a locked position. The handle is then pulled, and the cam levers undock the blade module from the chassis. When the cam motion is complete, the handle "locks out" in an open position to provide a carry handle.

In certain embodiments, when the handle is in a locked out position, colored markers are visible, showing the blade is "unlocked" and ready for removal from the system. The handle only unlocks and moves in again when the blade module is re-inserted in the blade chassis, and the cam levers dock the blade module into connectors on the chassis by pushing the button on the handle to actuate the handle back to the closed position.

In addition, in certain embodiments, the present invention locks open to communicate when a blade is in a removed state, and closes only when inserted into the blade enclosure. In one embodiment, the invention relates to a handle mechanism for use with a blade type information handling system which includes first and second mounting portions that are coupled to an information handling system chassis, a handle portion coupled to the first and second mounting portions that extends between the first and second mounting portions, a release device configured such that actuation of the release device unlocks the handle mechanism so that the handle can transition from a locked position to an unlocked position. The transition of the handle from the locked position to the unlocked position facilitates removal of the blade type information handling system from a chassis.

In another embodiment, the invention relates to an information handling system that includes a processor, memory coupled to the processor, an information handling system chassis, and a handle mechanism coupled to the information handling system chassis. The processor and the memory are mounted within the information handling system chassis. The handle mechanism includes first and second mounting portions coupled to an information handling system chassis, a handle portion coupled to the first and second mounting portions that extends between the first and second mounting portions, and a release device configured such that actuation of the release device unlocks the handle mechanism so that the handle can transition from a locked position to an unlocked position. The transition of the handle from the locked position to the unlocked position facilitates removal of the blade type information handling system from a chassis.

BRIEF DESCRIPTION OF THE DRAWINGS

The present invention may be better understood, and its numerous objects, features, and advantages made apparent to those skilled in the art by referencing the accompanying drawings. The use of the same reference number throughout the several figures designates a like or similar element.

DETAILED DESCRIPTION

Figure 1:
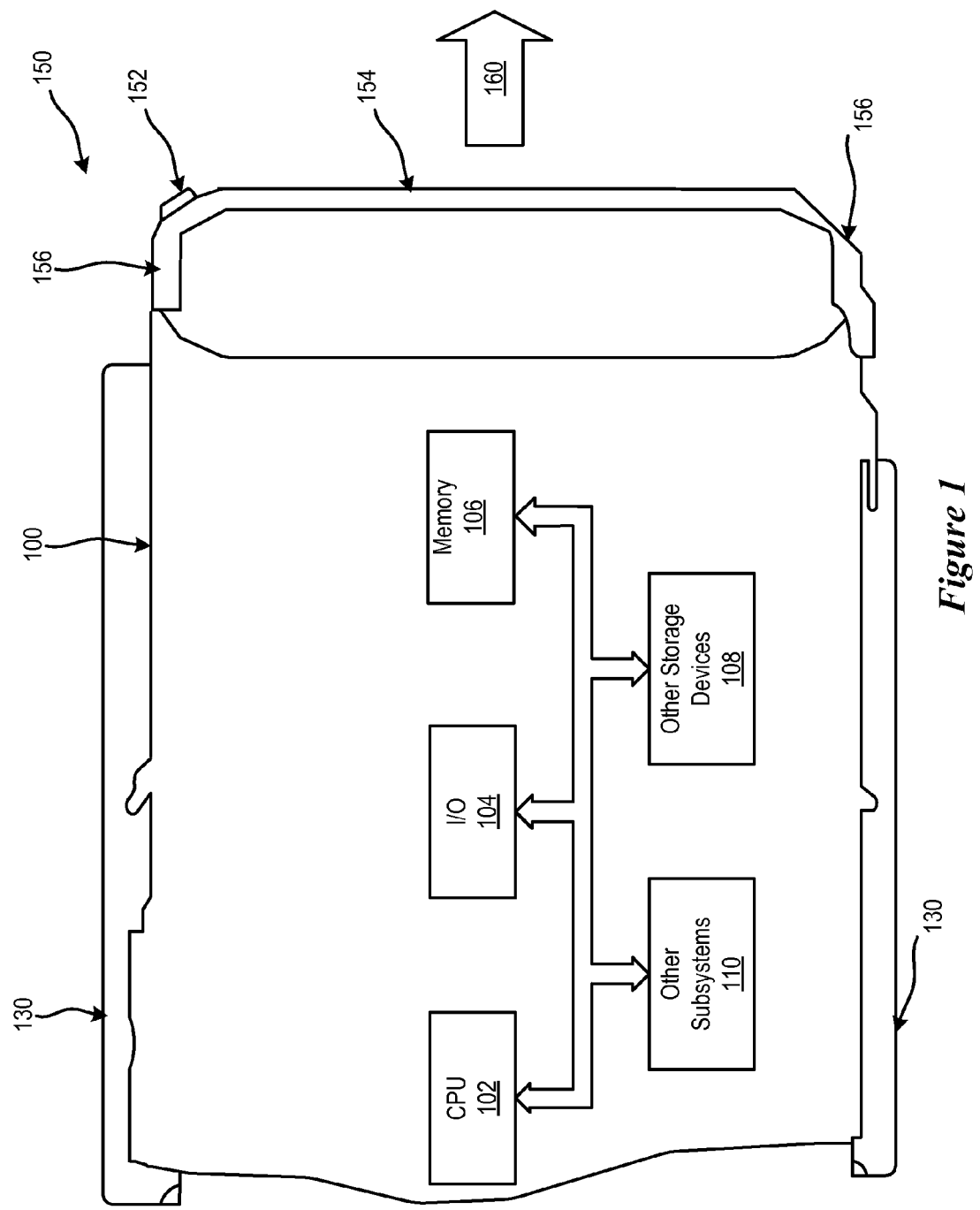
FIG. 1 shows a block diagram of an information handling system having a modular server handle.

FIG. 1 shows a block diagram of a blade server type information handling system having a modular server handle. The information handling system 100 includes a processor 102, input/output (I/O) devices 104, such as a display, a keyboard, a mouse, and associated controllers, a memory 106 including volatile memory such as random access memory (RAM) and non-volatile memory such as a hard disk and drive, and other storage devices 108, such as an optical disk and drive and other memory devices, and various other subsystems 110, all interconnected via one or more buses 112. The information handling system 100 may be mounted within a chassis 130 such as a blade chassis.

The information handling system 100 includes a translating handle mechanism 150. The handle mechanism 150 does not visibly function like a cam lever, and provides a carry handle solution when transporting the information handling system. In operation, to remove the information handling system 100, a user actuates a button 152 that releases a handle 154 from a locked position. The handle 154 is then pulled in a direction parallel to the direction for removing the information handling system 100 from the chassis 130 (e.g., the direction indicated by arrow 160, and cam levers undock the information handling system 100 from the chassis 130. When the cam motion is complete, the handle 154 "locks out" in an open position to provide a carry handle.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2A:
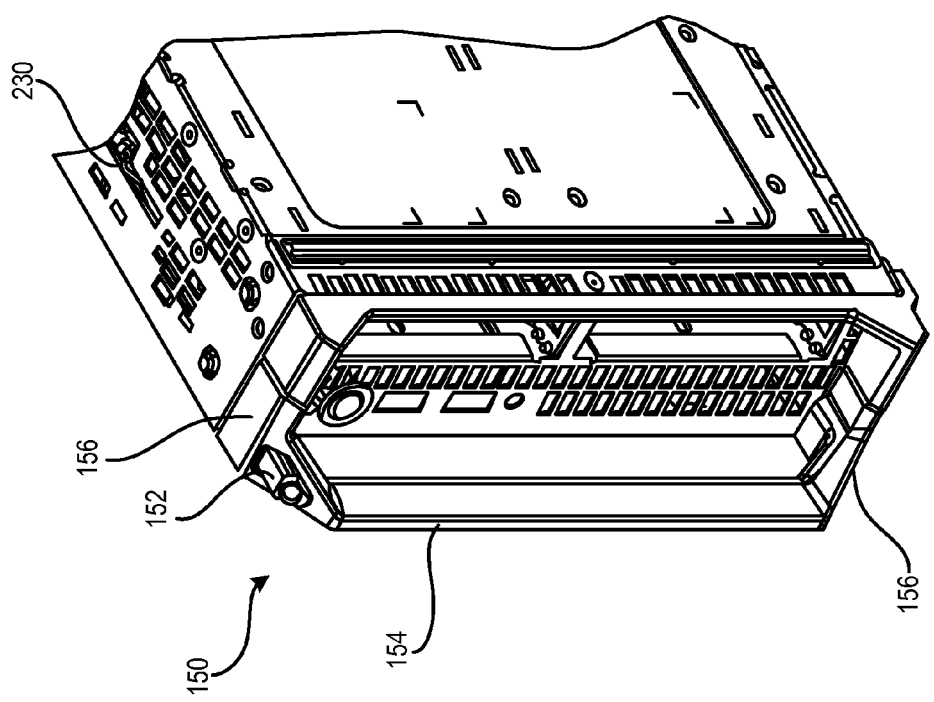
FIGS. 2A and 2B, generally referred to as FIG. 2, show perspective views of the operation of the modular server handle.
Figure 2B:
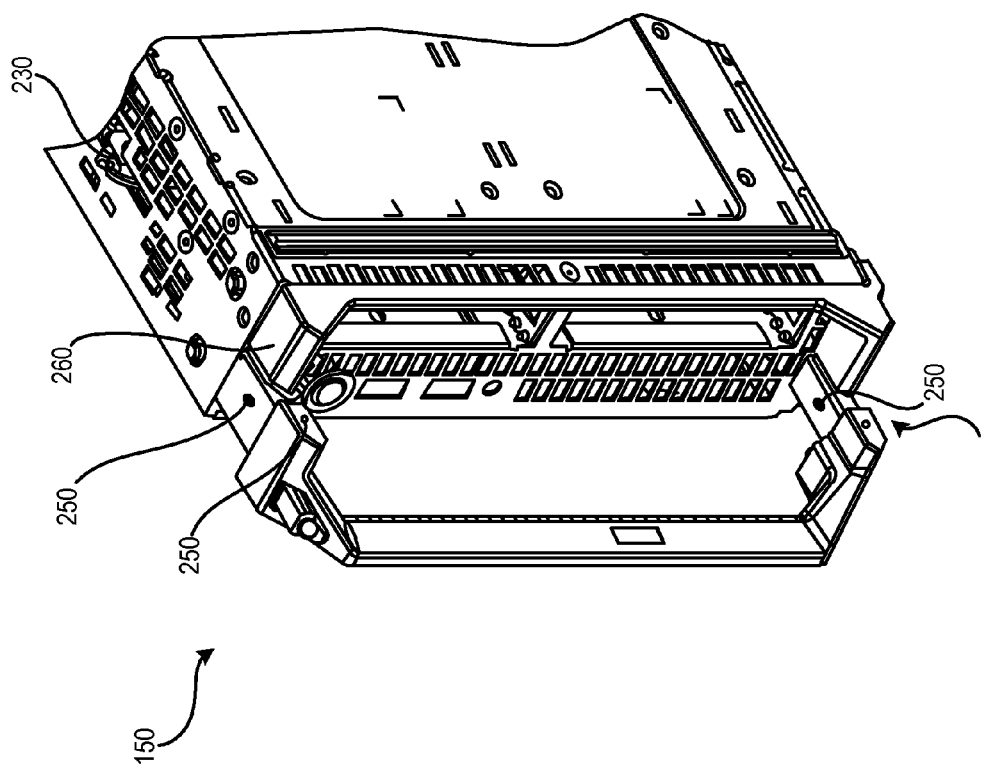

FIGS. 2A and 2B, generally referred to as FIG. 2, show perspective views of the operation of a modular server handle mechanism 150. The modular server handle mechanism 150 provides a translating handle mechanism that does not visibly function like a cam lever, and provides a carry handle solution when transporting the blade server type information handling system 100. The handle mechanism 150 includes the button 152 (i.e., a release device) as well as the handle portion 152. The handle portion 152 is mounted between a pair of mounting portions 156, which mount the handle mechanism to the chassis of the information handling system 100.

In operation, to remove the blade server type information handling system 100, a user pushes a button 152 that releases the handle mechanism 150 from a locked position. The handle is then pulled via the handle portion 154. As the handle mechanism is actuated by pulling the handle portion 154, the cam levers 230 undock the blade server type information handling system 100 from the chassis (e.g., 130). When the cam motion is complete, the handle mechanism 150 locks out in an open position (as shown in FIG. 2B) to provide a carry handle for the blade server type information handling system 100. The mounting portions 156 provide a track along which the handle mechanism extends when moved from the locked position to the unlocked position.

In certain embodiments, when the handle mechanism 150 is in a locked out position, colored indicator portions 250 are visible, showing the blade is "unlocked" and ready for removal from the system. These color indicator portions 250 can be in a color that provides a user with a warning that the blade module is not connected such as a red color. The handle only unlocks and moves in again when the blade module is re-inserted in the blade chassis. The cam levers 230 dock the blade server type information handling system 100 into connectors on the chassis (not shown) by pushing the handle.

In addition, in certain embodiments, the present invention locks open to communicate when a blade is in a removed state, and closes only when inserted into the blade enclosure.

Figure 3A:
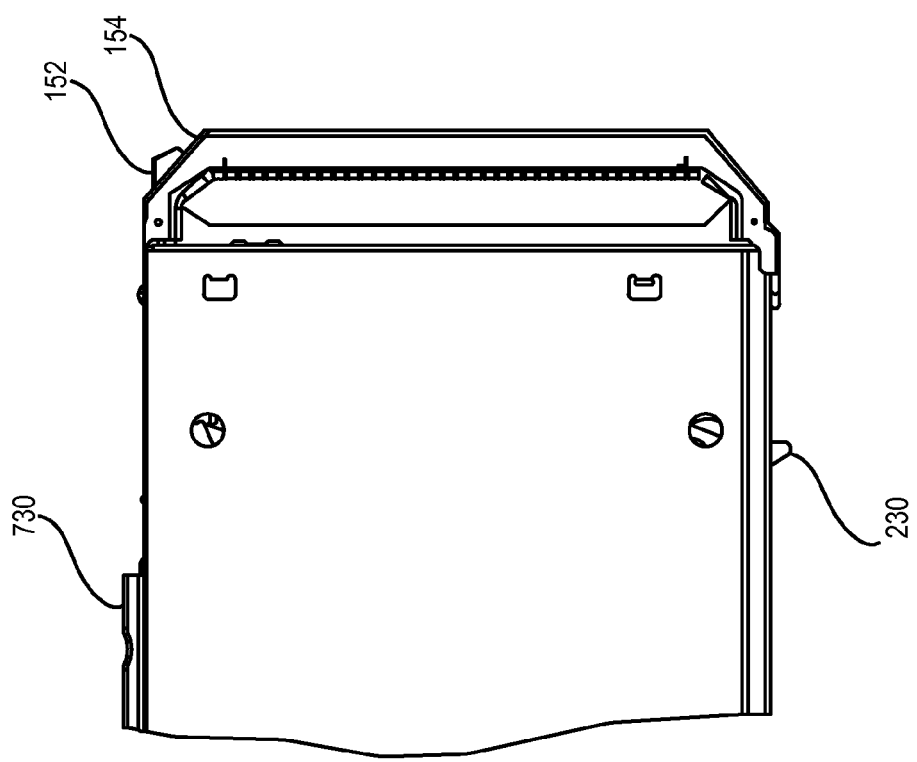
FIGS. 3A, 3B and 3C, generally referred to as FIG. 3, show left, front and right side views of the modular server handle in a closed position.
Figure 3B:
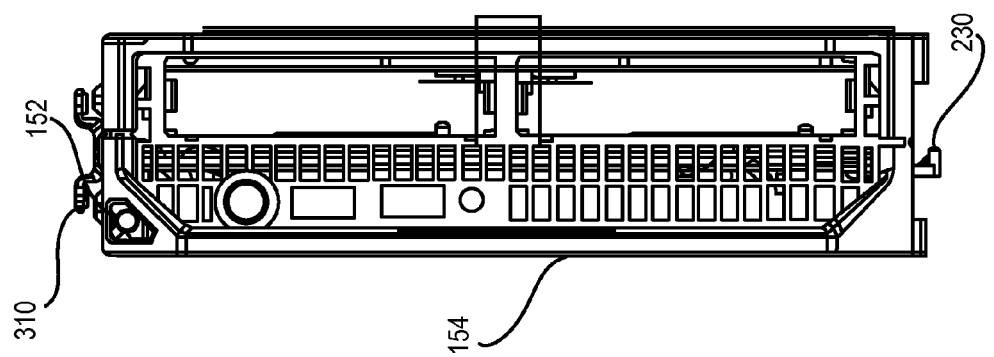
Figure 3C:
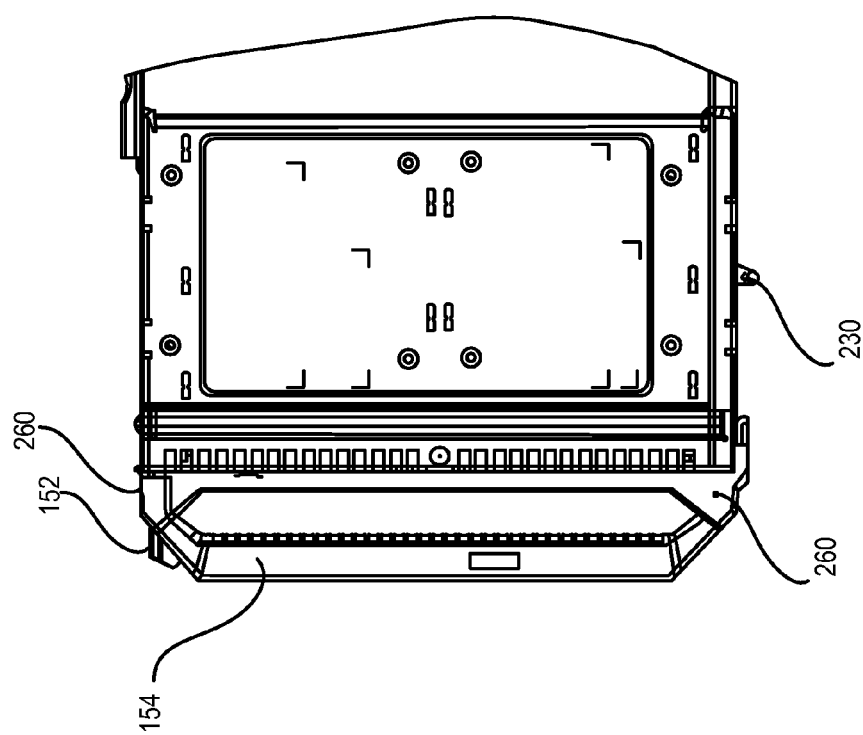

FIGS. 3A, 3B and 3C, generally referred to as FIG. 3, show left, front and right side views, respectively, of the modular server handle mechanism in a closed position. More specifically, when the handle mechanism 150 in the closed position, the cam levers 230 are positioned to dock the blade server type information handling system 100 to the chassis 130 in which the blade server type information handling system 100 is inserted. As can be seen from FIG. 3B, the handle portion 154 of the handle mechanism is oriented so that the front of the blade server type information handling system 100 is visible and accessible. For example, in certain embodiments, the handle mechanism extends parallel to one side (e.g., the left side) of the blade server type information handling system 100.

Figure 4A:
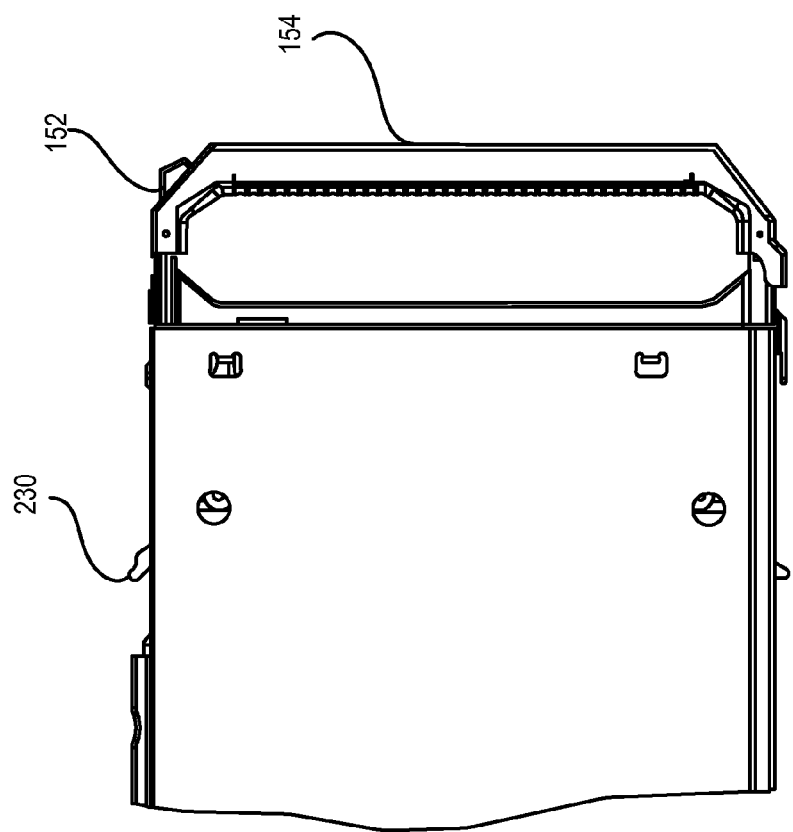
FIGS. 4A, 4B and 4C, generally referred to as FIG. 4, show left, front and right side views of the modular server handle in an open position.
Figure 4B:
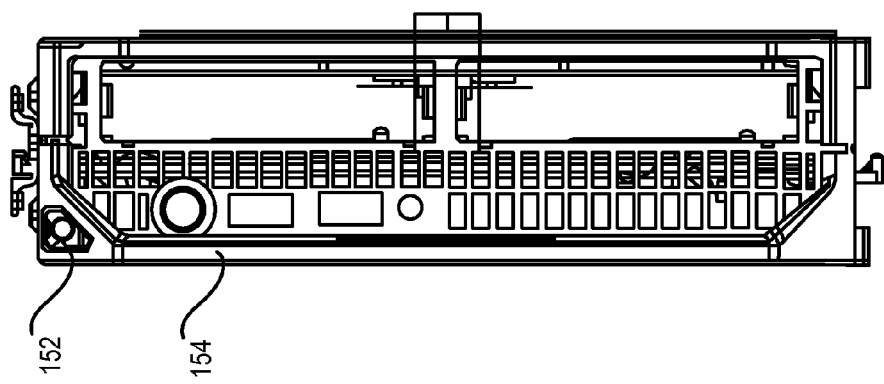
Figure 4C:
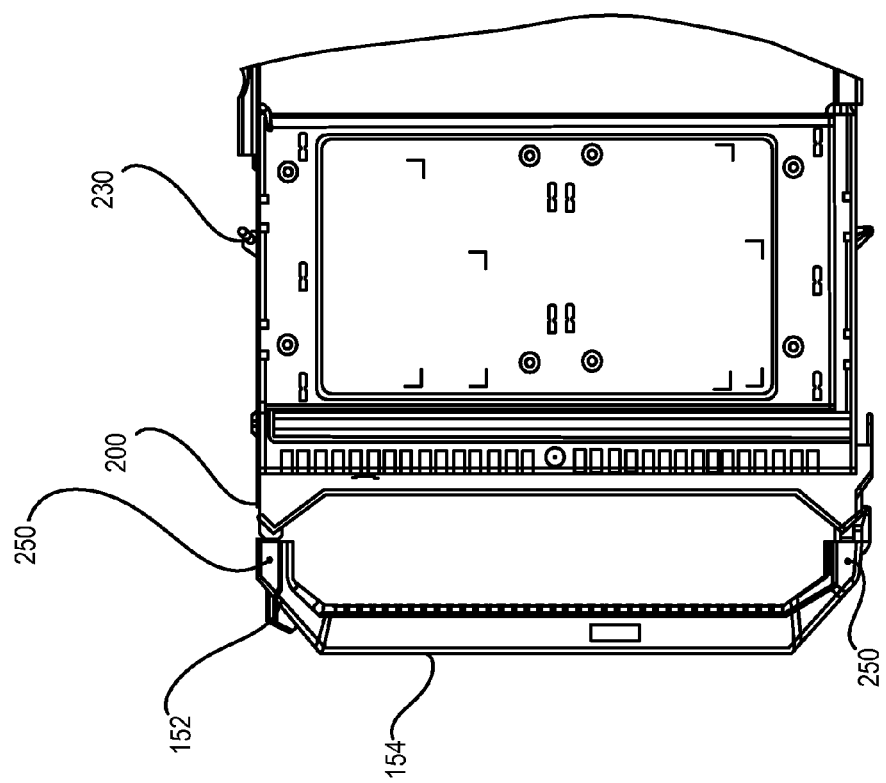

FIGS. 4A, 4B and 4C, generally referred to as FIG. 4, show left, front and right side views, respectively, of the modular server handle mechanism in an open position. More specifically, when the handle mechanism 150 is in the open position, the cam levers 230 are positioned to undock the blade server type information handling system 100 from the chassis in which the blade server type information handling system 100 is inserted. As can be seen from FIG. 4C, the visible indicator portions 250 are visible when the handle mechanism in an open position, but are covered by part of the handle mechanism 260 when the handle mechanism 150 is in a closed position.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A handle mechanism for use with a blade type information handling system comprising:

first and second mounting portions, the first and second mounting portions being coupled to an information handling system chassis;

a handle portion coupled to the first and second mounting portions, the handle portion extending between the first and second mounting portions;

a release device, the release device being configured such that actuation of the release device unlocks the handle mechanism so that the handle can transition from a locked position to an unlocked position, the transition of the handle from the locked position to the unlocked position facilitating removal of the blade type information handling system from a chassis.

2. The handle mechanism of claim 1 further comprising:
visible indicator portion, the visible indicator portion being visible when the handle mechanism in the unlocked position and covered by at least a portion of the handle mechanism when the handle is in the locked position.

3. The handle mechanism of claim 1 wherein:
when the handle is transitioned from the locked position to the unlocked position, the handle can only transition back to the locked position when the blade type information handling system is re-inserted in the chassis.

4. The handle mechanism of claim 1 wherein:
inserting the blade type information handling system into the chassis automatically unlocks the handle mechanism and allows the blade type information handling system to be mated with a connector on the chassis.

5. The handle mechanism of claim 1 wherein:
the mounting portions provide a track along which the handle mechanism extends when moved from the locked position to the unlocked position.

6. The handle mechanism of claim 1 wherein:
the mounting portions extend in a substantially perpendicular direction from the information handling system chassis and the handle portion extends in a substantially parallel direction relative to a front portion of the information handling system chassis.

7. The handle mechanism of claim 1 wherein:
the handle portion is oriented so that a front of the information handling system is visible and accessible.

8. An information handling system comprising
a processor;
memory coupled to the processor;
an information handling system chassis, the processor and the memory being mounted within the information handling system chassis a handle mechanism coupled to the information handling system chassis, the handle mechanism comprising:
first and second mounting portions, the first and second mounting portions being coupled to an information handling system chassis;

a handle portion coupled to the first and second mounting portions, the handle portion extending between the first and second mounting portions;

a release device, the release device being configured such that actuation of the release device unlocks the handle mechanism so that the handle can transition from a locked position to an unlocked position, the transition of the handle from the locked position to the unlocked position facilitating removal of the blade type information handling system from a chassis.

9. The information handling system of claim 8 wherein the handle mechanism further comprises:
visible indicator portion, the visible indicator portion being visible when the handle mechanism in the unlocked position and covered by at least a portion of the handle mechanism when the handle is in the locked position.

10. The information handling system of claim 8 wherein:
when the handle is transitioned from the locked position to the unlocked position, the handle can only transition back to the locked position when the blade type information handling system is re-inserted in the chassis.

11. The information handling system of claim 8 wherein:
inserting the blade type information handling system into the chassis automatically unlocks the handle mechanism and allows the blade type information handling system to be mated with a connector on the chassis.

12. The information handling system of claim 8 wherein:
the mounting portions provide a track along which the handle mechanism extends when moved from the locked position to the unlocked position.

13. The information handling system of claim 8 wherein:
the mounting portions extend in a substantially perpendicular direction from the information handling system chassis and the handle portion extends in a substantially parallel direction relative to a front portion of the information handling system chassis.

14. The information handling system of claim 8 wherein:
the handle portion is oriented so that a front of the information handling system chassis is visible and accessible.

* * * * *

UNITED STATES PATENT AND TRADEMARK OFFICE
CERTIFICATE OF CORRECTION

| | | |
|---|---|---|
| PATENT NO. | : 7,576,979 B1 | Page 1 of 1 |
| APPLICATION NO. | : 12/117971 | |
| DATED | : August 18, 2009 | |
| INVENTOR(S) | : Timothy C. Dearborn et al. | |

It is certified that error appears in the above-identified patent and that said Letters Patent is hereby corrected as shown below:

Title page, item 75

The name of the second inventor should be George Holt.

Signed and Sealed this
Twelfth Day of January, 2016

Michelle K. Lee
*Director of the United States Patent and Trademark Office*